(12) United States Patent
Flynn et al.

(10) Patent No.: US 7,977,822 B2
(45) Date of Patent: Jul. 12, 2011

(54) DYNAMICALLY CHANGING CONTROL OF SEQUENCED POWER GATING

(75) Inventors: David Walter Flynn, Cambridge (GB); Sachin Satish Idgunji, San Jose, CA (US)

(73) Assignee: ARM Limited, Cambridge (GB)

( * ) Notice: Subject to any disclaimer, the term of this patent is extended or adjusted under 35 U.S.C. 154(b) by 434 days.

(21) Appl. No.: 11/979,542

(22) Filed: Nov. 5, 2007

(65) Prior Publication Data

US 2009/0115256 A1 May 7, 2009

(51) Int. Cl.
*H01H 31/00* (2006.01)
*H01H 33/59* (2006.01)
*H01H 47/00* (2006.01)
*H01H 85/46* (2006.01)
*H01H 19/14* (2006.01)

(52) U.S. Cl. ............ 307/115; 307/41; 307/81; 307/137; 307/138; 713/300; 713/330

(58) Field of Classification Search .................... 307/115
See application file for complete search history.

(56) References Cited

U.S. PATENT DOCUMENTS

| | | | |
|---|---|---|---|
| 6,366,061 B1 * | 4/2002 | Carley et al. | 323/223 |
| 6,459,171 B1 * | 10/2002 | Leifer | 307/52 |
| 6,600,242 B1 * | 7/2003 | Dennison | 307/125 |
| 6,651,178 B1 * | 11/2003 | Voegeli et al. | 713/300 |
| 2002/0093062 A1 * | 7/2002 | Eden et al. | 257/401 |
| 2004/0033079 A1 * | 2/2004 | Sheth et al. | 398/135 |
| 2005/0012396 A1 * | 1/2005 | Chidambaram et al. | 307/77 |
| 2005/0088158 A1 * | 4/2005 | Horiguchi et al. | 323/282 |
| 2005/0110349 A1 * | 5/2005 | Bertrand | 307/112 |
| 2005/0173985 A1 * | 8/2005 | Eguchi et al. | 307/10.1 |
| 2006/0236044 A1 * | 10/2006 | Chan et al. | 711/156 |
| 2006/0242435 A1 * | 10/2006 | Swope | 713/300 |

OTHER PUBLICATIONS

S. Kim et al, "Understanding and Minimizing Ground Bounce During Mode Transition of Power Gating Structures" *ISLPED '03*, Aug. 2003, pp. 22-25.

* cited by examiner

*Primary Examiner* — Jared J Fureman
*Assistant Examiner* — Justen Fauth
(74) *Attorney, Agent, or Firm* — Nixon & Vanderhye P.C.

(57) ABSTRACT

Power control circuitry for controlling connection of a voltage source to a switched power rail powering an associated circuit is provided. A plurality of switch blocks are connected in parallel between the switched power rail and the voltage source, each switch block being controlled by an enable signal provided by a switch controller. The switch controller performs a turn-on sequence providing a series of enable signal patterns to the switch blocks. The switch controller applies a time varying generation operation to at least one sequence stage of a predetermined turn-on sequence to produce a corresponding enable signal pattern for that sequence stage. When the turn-on sequence is later repeated, the enable signal pattern produced for at least one of the sequence stages differs from the enable signal pattern previously produced for that sequence stage.

18 Claims, 6 Drawing Sheets

Sequence 1

| | $P_0$ | $P_1$ | $P_2$ | $P_3$ | $P_4$ | $P_5$ | $P_6$ | $P_7$ |
|---|---|---|---|---|---|---|---|---|
| S=0 | 0 | 0 | 0 | 0 | 0 | 0 | 0 | 0 |
| S=1 | 1 | 0 | 0 | 0 | 0 | 0 | 0 | 0 |
| S=2 | 1 | 1 | 0 | 0 | 0 | 0 | 0 | 0 |
| S=3 | 1 | 1 | 1 | 1 | 0 | 0 | 0 | 0 |
| S=4 | 1 | 1 | 1 | 1 | 1 | 1 | 1 | 1 |

Sequence Stages

Sequence 2

| | $P_0$ | $P_1$ | $P_2$ | $P_3$ | $P_4$ | $P_5$ | $P_6$ | $P_7$ |
|---|---|---|---|---|---|---|---|---|
| S=0 | 0 | 0 | 0 | 0 | 0 | 0 | 0 | 0 |
| S=1 | 1 | 0 | 0 | 0 | 0 | 0 | 0 | 0 |
| S=2 | 1 | 1 | 0 | 0 | 0 | 0 | 0 | 0 |
| S=3 | 1 | 1 | 1 | 0 | 0 | 0 | 0 | 0 |
| S=4 | 1 | 1 | 1 | 1 | 0 | 0 | 0 | 0 |
| S=5 | 1 | 1 | 1 | 1 | 1 | 0 | 0 | 0 |
| S=6 | 1 | 1 | 1 | 1 | 1 | 1 | 0 | 0 |
| S=7 | 1 | 1 | 1 | 1 | 1 | 1 | 1 | 0 |
| S=8 | 1 | 1 | 1 | 1 | 1 | 1 | 1 | 1 |

Sequence Stages

Fig. 2

DYNAMICALLY CHANGING CONTROL OF SEQUENCED POWER GATING

BACKGROUND OF THE INVENTION

1. Field of the Invention

This invention relates to the field of power control circuitry for an associated circuit. More particularly, this invention relates to power control circuitry for controlling connection of a voltage source to a switched power rail powering an associated circuit.

2. Description of the Prior Art

It is known to provide circuits (for example integrated circuits) including power rails connected via switch blocks to switched power rails (also referred to herein as virtual power rails). The logic blocks within the integrated circuit then draw their power from the virtual power rails. The switch blocks, which are typically high threshold voltage header and/or footer transistors, can be used to isolate the virtual power rail from the main power rail and accordingly isolate the logic blocks from the power supply. This is useful in reducing power consumption of the integrated circuit, e.g. by reducing the static leakage current therethrough. Such switches are sometimes referred to as power-gating switches.

It is also known that if a set of such switch blocks is turned on simultaneously, a significant supply current pulse may result, possibly large enough to cause state disruption in (or even damage to) components of the integrated circuit. This supply current pulse (or "surge") results from the peak current required to recharge all the capacitive nodes of the integrated circuit. For this reason, the turn-on of the switch blocks may be delayed relative to each other to reduce this surge current.

Sequenced power control signalling is described in "Understanding and minimizing ground bounce during mode transition of power gating structures", Kim et al., ISLPED 2003, Seoul, Korea, pp. 22-25.

Whilst the above approach is successful in avoiding a large supply current pulse when switching on, it suffers from the problem that switch blocks which are turned on early in a turn-on sequence suffer greater "stress" than switches later in the turn-on procedure, due to the fact that the initial supply current pulse, although reduced in magnitude in the integrated circuit as a whole, is nevertheless experienced most strongly by the switches used earliest in the turn-on procedure. The resulting heating effects and increased local current density caused by the initial supply current pulse lead to the degradation of those switch blocks by electromigration (the transport of material caused by the gradual movement of the ions in a conductor due to the momentum transfer between conducting electrons and diffusing metal atoms). As a result, during the lifetime of the integrated circuit, following repeated turn-on and turn-off cycles the increased stress experienced by some switches may cause them to fail significantly sooner than other less "stressed" switch blocks.

SUMMARY OF THE INVENTION

Viewed from one aspect, the present invention provides power control circuitry for controlling connection of a voltage source to a switched power rail powering an associated circuit comprising: a plurality of switch blocks connected in parallel between said switched power rail and said voltage source, each switch block being controlled by an enable signal which when set causes that switch block to connect said switched power rail to said voltage source; and a switch controller for performing a turn-on sequence comprising a plurality of sequence stages, such that the switch controller provides for each sequence stage an enable signal pattern identifying which enable signals are set; for at least one of the sequence stages, said switch controller being configured to apply a time-varying generation operation when generating the corresponding enable signal pattern, whereby when the turn-on sequence is later repeated, a later enable signal pattern produced for said at least one of said sequence stages differs from the enable signal pattern previously produced for said at least one of said sequence stages.

The present technique recognises that employing a turn-on sequence by which a plurality of switch blocks connected in parallel between a switched power rail and a voltage source are switched on may result in increased stress (and consequently, after repeated iterations of that turn-on procedure, earlier failure) of switch blocks used earlier in that turn-on sequence. In particular, the present invention recognises that this stress may be shared out more evenly between the switch blocks by providing a switch controller for producing enable signal patterns to control which switch blocks are selectively turned on at any given stage in a turn-on sequence. The switch controller employs a time-varying generation operation to generate the enable signal pattern for that sequence stage. Then, when the turn-on sequence is later repeated, by altering the generation operation, the enable signal pattern generated by the generation operation for a particular stage of the turn-on sequence is different from the enable signal pattern previously produced for that turn-on sequence stage. For example, the first stage of a turn-on sequence may comprise turning on a single switch block, and the time-varying generation operation may provide that the switch block selected to be the single switch block turned on in the first stage of the turn-on sequence changes each time the turn-on sequence is carried out. In this way, the stress resulting from being the first switch block turned on in the turn-on sequence is shared out between all of the switch blocks.

It will be appreciated that the time varying generation operation could take a variety of forms, but in one embodiment of the invention, the time-varying generation operation is a time-varying mapping operation, said time-varying mapping operation being applied to a configuration pattern of said at least one of the sequence stages to generate the corresponding enable signal pattern.

The time-variation of the generation operation could be implemented in a variety of ways. However, in one embodiment the time-varying generation operation is changed dependent on a control input. This control input can take a variety of forms such as being a counter value or a pseudorandom generated value. In the case that the control input is a counter value, it will be appreciated that the counter value could be changed in various ways, but in one embodiment the counter value is incremented each time a turn-off sequence is applied to decouple the switched power rail from the voltage source. In this way, each time the turn-on procedure is carried out, the series of enable signal patterns applied to the switch blocks differs from the previous series.

It will be appreciated that the time-varying mapping operation could be implemented in a variety of ways. However, in one embodiment, the time-varying mapping operation employs a predetermined plurality of mapping functions, a current mapping function being selected from said predetermined plurality of mapping functions depending on the control input. Thus, by the simple mechanism of changing the control input, the mapping function employed by the time-varying mapping operation can be changed.

It will be appreciated by those in this technical field that when implementing a turn-on sequence, that it is particularly the first subset of switch blocks to be turned on which must cope with the above described problems of "stress". This subset of switch blocks is referred to here as the starter switch blocks. Whilst it will be appreciated that all switch blocks that connect the switched power rail to the voltage source could be starter switch blocks, in one embodiment the switch blocks comprise at least one main switch block between the switched power rail and the voltage course, the switch controller being configured to turn on the at least one main switch block once the turn-on sequence for the starter switch blocks has been performed.

It will be appreciated that the present technique could be applied to selectively connect a supply voltage power rail to an associated circuit, and in one such embodiment a supply voltage power rail is coupled to the voltage source, the plurality of switch blocks being header blocks coupled to the supply voltage power rail and serving to connect the switched power rail to the voltage course via the supply voltage power rail. Alternatively, the present technique could be used to selectively connect a ground voltage power rail to the associated circuit and in such an embodiment a ground voltage power rail is coupled to the voltage source, the plurality of switch blocks being footer blocks coupled to the ground voltage power rail and serving to connect the switched power rail to the voltage source via the ground voltage power rail.

Whilst it will be appreciated that the time-varying mapping function could generate the enable signal pattern by a variety of mapping functions including one-to-one, one-to-many or many-to-one mappings, in one embodiment the time-varying mapping function reorders the configuration pattern to produce the enable signal pattern.

It will be apparent to those skilled in this technical field that the time-varying generation function may be implemented in a variety of ways. In one embodiment, the time-varying generation operation is implemented by multiplexer circuitry, whilst in another embodiment, the time-varying generation operation is implemented by a lookup table.

As described above, it is typically the earlier switch blocks to be turned on which suffer the greatest stress, and consequently the switch controller may be configured to only alter the enable signal pattern produced for the first sequence stages of the turn-on sequence (perhaps even only changing the enable signal pattern produced for the very first stage of the sequence), but over many iterations of the turn-on sequence any variation in the statistical distribution of usage of switch blocks may result in earlier failure of a particular switch block. Accordingly, in one embodiment each later enable signal pattern produced for each of the sequence stages differs from the enable signal pattern previously produced for each corresponding one of the sequence stages.

Viewed from a second aspect, the present invention provides a method of controlling connection of a voltage source to a switched power rail powering an associated circuit, comprising the steps of: connecting a plurality of switch blocks in parallel between said switched power rail and said voltage source, each switch block being controlled by an enable signal which when set causes that switch block to connect said switched power rail to said voltage source; performing a turn-on sequence comprising a plurality of sequence stages, by providing for each sequence stage an enable signal pattern identifying which enable signals are set; for at least one of the sequence stages, applying a time-varying generation operation when generating the corresponding enable signal pattern; whereby when later repeating the turn-on sequence, a later enable signal pattern for said at least one of said sequence stages differs from the enable signal pattern previously produced for said at least one of said sequence stages.

Viewed from a third aspect, the present invention provides power control circuitry for controlling connection of a voltage source means to a switched power rail means powering an associated circuit comprising: a plurality of switch blocks means connected in parallel between said switched power rail means and said voltage source means, each switch block means being controlled by an enable signal which when set causes that switch block means to connect said switched power rail means to said voltage source means; and a switch controller means for performing a turn-on sequence comprising a plurality of sequence stages, such that the switch controller means provides for each sequence stage an enable signal pattern identifying which enable signals are set; for at least one of the sequence stages, said switch controller means being configured to apply a time-varying generation operation when generating the corresponding enable signal pattern, whereby when the turn-on sequence is later repeated, a later enable signal pattern produced for said at least one of said sequence stages differs from the enable signal pattern previously produced for said at least one of said sequence stages.

BRIEF DESCRIPTION OF THE DRAWINGS

The above, and other objects, features and advantages of this invention will be apparent from the following detailed description of illustrative embodiments which is to be read in connection with the accompanying drawings.

FIG. 2 schematically illustrates the configuration patterns of each sequence stage of two alternative turn-on sequences;

DESCRIPTION OF EMBODIMENTS

Figure 1:
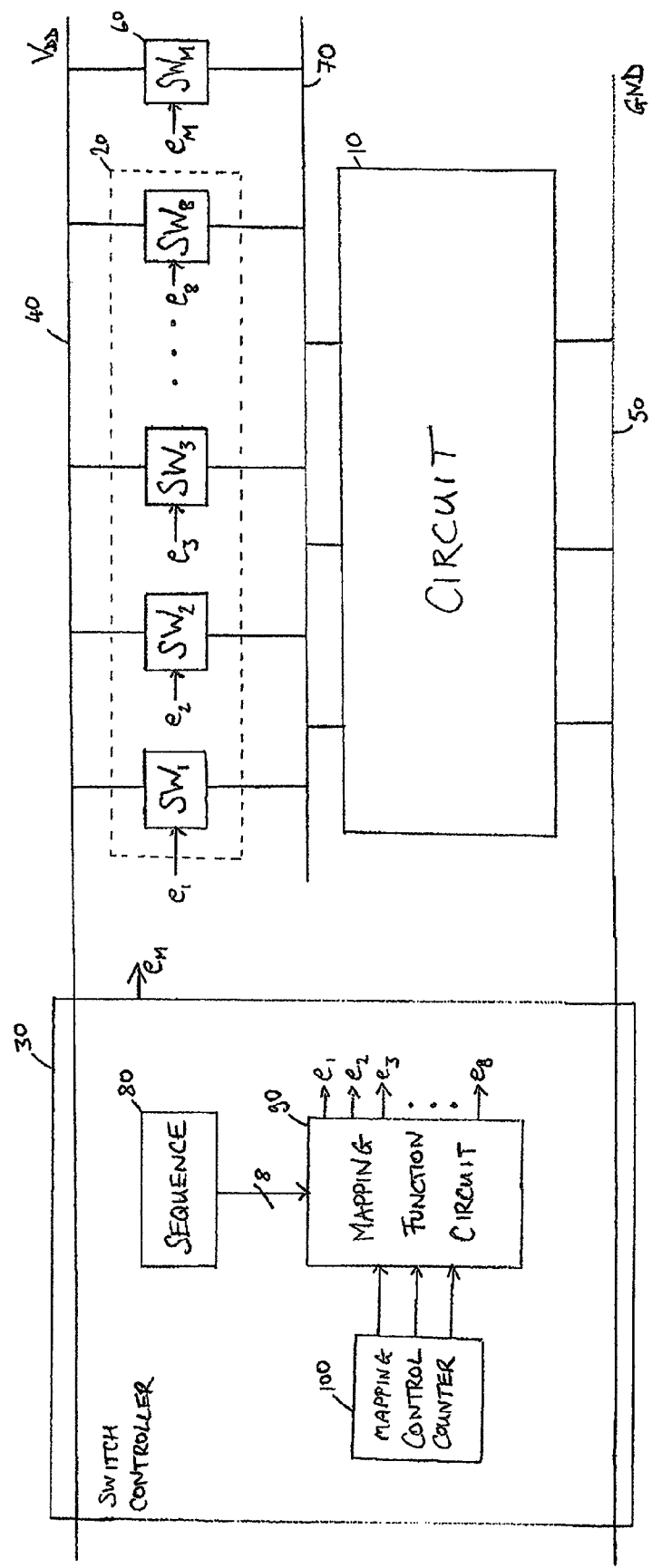
FIG. 1 schematically illustrates an integrated circuit employing main power rails, a virtual power rail, header switches and a switch controller for providing enable signals to each of the header switches.

FIG. 1 schematically illustrates an integrated circuit comprising circuit 10, header switches 20 and 60, and switch controller 30. Circuit 10 could, for, example be a power gated RAM or indeed any circuitry for which it is appropriate to provide power gating control to allow the circuit to be isolated from the voltage source. Circuit 10 is situated between switched power rail 70 and ground voltage power rail 50. In order to provide power to circuit 10, starter header switches 20 and main header switch 60 are provided for connecting supply voltage ($V_{DD}$) power rail 40 to the switched power rail 70. Control over turn-on header switches 20 and main header switch 60 is provided by a series of enable signals ($e_i$) generated by switch controller 30. Whilst each header switch $SW_i$ is schematically illustrated as a single block, each switch block $SW_i$ could in fact comprise a set of switches operating in parallel under the control of enable signal $e_i$.

Switch controller 30 is situated in permanent connection to supply voltage power rail 40 and ground voltage power rail 50. Switch controller 30 provides the enable signals as follows. A predetermined turn-on sequence is provided by sequence logic 80 comprising a set of sequence stages, each sequence stage having a configuration pattern representing the switching status of each of the turn-on header switches 20. Two example sequences, as could be provided by sequence logic 80, are illustrated in FIG. 2. In FIG. 2, each sequence comprises a turn-off stage (s=0), followed by a turn-on sequence (s=1, 2, 3 . . . ) having multiple stages. Sequence logic 80 provides each sequence stage as an eight-bit wide signal to mapping function circuit 90. Mapping circuit 90 then converts each sequence stage configuration pattern into an enable signal pattern embodied by enable signals $e_1$ to $e_8$. The simplest mapping that mapping function circuit 90 can perform is a direct one-to-one mapping of the eight-bit wide sequence stage configuration pattern onto the enable signal pattern without alteration. More generally, mapping function circuit 90 could apply a hash function to a sequence step configuration pattern to generate the enable pattern. In the example illustrated, mapping function circuit 90 is controlled by control signals which it receives from mapping control counter 100. These control signals are embodied as a three-bit wide control signal. When sequence logic 80 has provided mapping circuit 90 with a full set of sequence stages, i.e. a fill turn-on sequence has been carried out, switch controller 30 generates a main enable signal em which controls the switching status of main header switch 60. This main enable signal is activated once a full turn-on sequence, generated by sequence logic 80 and mapped by mapping function circuit 90, has been provided to the turn-on header switches 20. Circuit 10 is then fully powered.

Later, when power to the circuit is turned off, mapping control counter 100 increments its control counter such that the control signals it passes to mapping function circuit 90 are incremented by a count of one. Thus, for the next turn-on sequence, the mapping will be different. In this example embodiment (being a three-bit counter) mapping control counter 100 can provide mapping function circuit 90 with eight different control signals. This corresponds to the eight turn-on header switches 20 ($SW_1$ to $SW_8$), such that any given element of a sequence stage configuration pattern may be translated into an enable signal for any one of the eight turn-on header switches, depending on the current control signal being generated by mapping control counter 100.

Thus, by varying the mapping of the turn-on sequence, the order in which the turn-on header switches 20 are used to implement the sequence stages of a given turn-on sequence is varied each time that turn-on sequence is carried out. This means that the stress resulting from being an earlier switch in a turn-on sequence (resulting from the turn-on surge current) is, over the course of time, equally shared out between the turn-on header switches. A particularly efficient way of implementing this sharing-out is a mapping which ensures that the next switch to be turned on is the one that has been least recently used (i.e. least recently stressed).

FIG. 2 illustrates two example sequences. Each sequence is composed of a set of sequence stages (s), each sequence stage comprising a configuration pattern composed of eight pattern bits ($p_0$ to $p_7$). Sequence 1 has an exponential turn-on sequence. At sequence stage s=0, all switches are off, regardless of the mapping imposed thereon. This is followed by a turn-on sequence, wherein at sequence stage s=1 only one turn-on header switch is turned on; at sequence stage s=2 two header switches are turned on; at sequence stage s=3 four header switches are turned on; and at sequence stage s=4 all eight header switches are turned on. Alternative sequence 2 has a stepped turned-on sequence, whereby at each sequence stage one more header switch is turned on than at the previous stage. Sequence 1 gives a faster turn-on sequence, but sequence 2 gives a more measured spread of the inrush current over the turn-on header switches.

Figure 3:
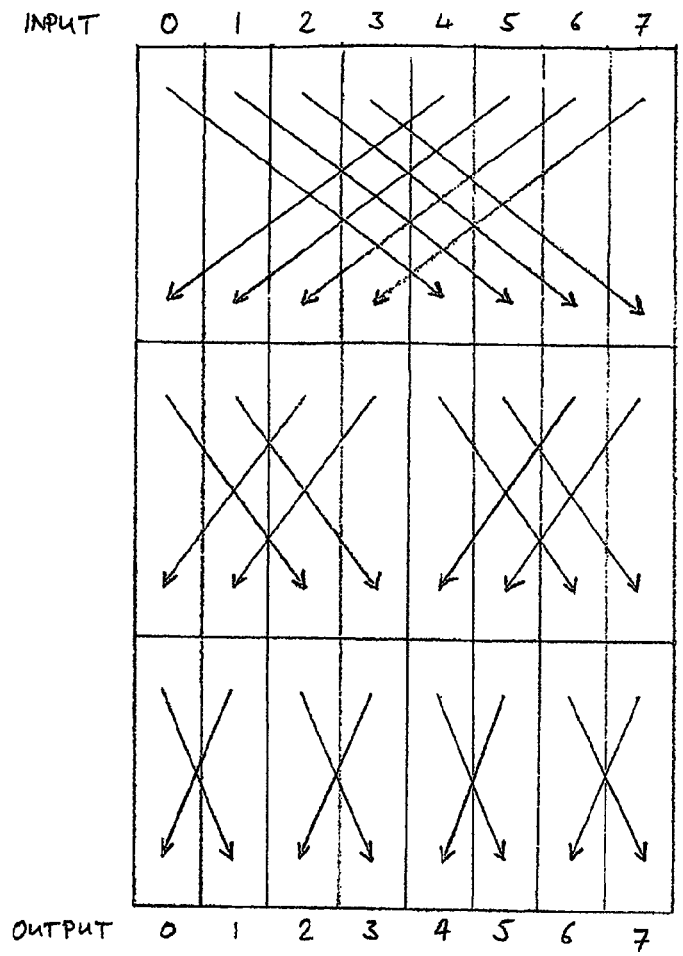
FIG. 3 schematically illustrates a mapping operation comprising three mapping functions.

FIG. 3 schematically illustrates mapping operations that may be carried out by mapping function circuit 90 by implementing three different mapping functions. Each mapping function is activated by one-bit of the three-bit control signal coming from mapping control counter 100, labelled here as MAP COUNT [x]. Mapping function 1 switches the first four and last four bits of a configuration pattern. Mapping function 2 swaps adjacent pairs of bits in a configuration pattern, and mapping function 3 swaps adjacent bits in the configuration pattern. Thus, for example input bit 0 can be translated to output bit 7 by enabling all three mapping functions, i.e. MAP COUNT=7 (or binary 111). As another example input bit 3 can be translated to output bit 6 by enabling mapping functions 1 and 3, i.e. MAP COUNT=5 (or binary 101). If MAP COUNT=0 then the inputs map directly to the corresponding outputs.

Figure 4:
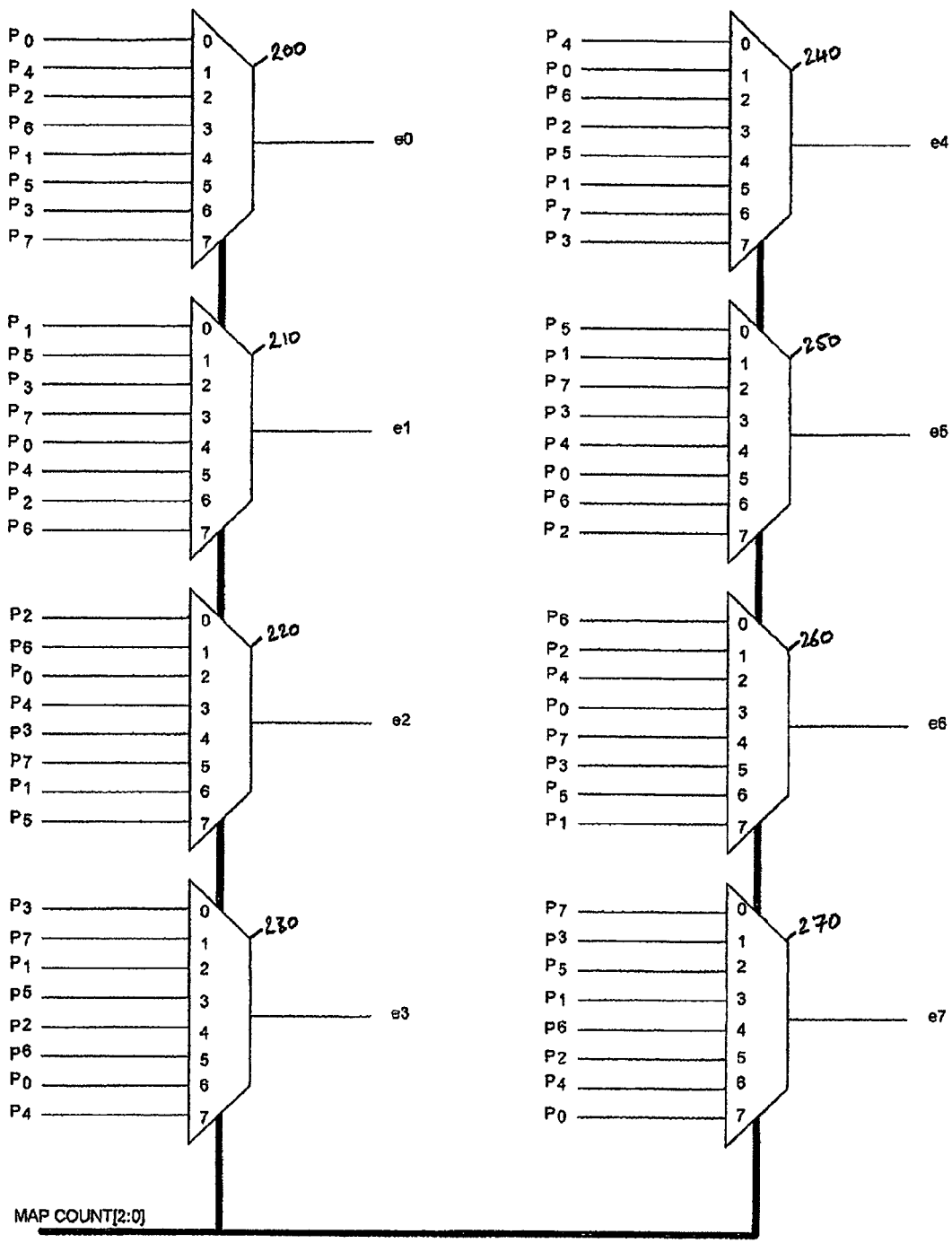
FIG. 4 schematically illustrates a multiplexer implementation of the mapping operation of FIG. 3.

FIG. 4 illustrates a multiplexer implementation of the mapping operation illustrated in FIG. 3. Here MAP COUNT is provided as the selection input to a set of eight multiplexers 200 to 270. Each multiplexer has its inputs configured such that the eight possible values of MAP COUNT steer that multiplexer to generate an output corresponding to the mappings shown in FIG. 3. The input values are given by the pattern bits $p_0$ to $p_7$ from FIG. 2. Taking the examples of FIG. 3, when MAP COUNT is 7, each multiplexer provides its last (viewed downwardly in the figure) input value as its output, i.e. multiplexer 200 provides input $p_7$ as $e_0$, multiplexer 210 provides input $p_6$ as $e_1$ and so on, multiplexer 270 providing input $p_0$ as $e_7$. In the second example, when MAP COUNT equals 5, then each of multiplexers 200 to 270 takes its fifth input to provide as its output. Hence, multiplexer 200 generated $e_0$ from input $p_5$, multiplexer 210 generates $e_1$ from input $p_4$, multiplexer 220 generates $e_2$ from input $p_7$ and so on, multiplexer 270 generating $e_7$ from input $p_2$. In the final example, when MAP COUNT=0 then the inputs map directly to the corresponding outputs, $e_i$ coming from input $p_i$.

Figure 5:
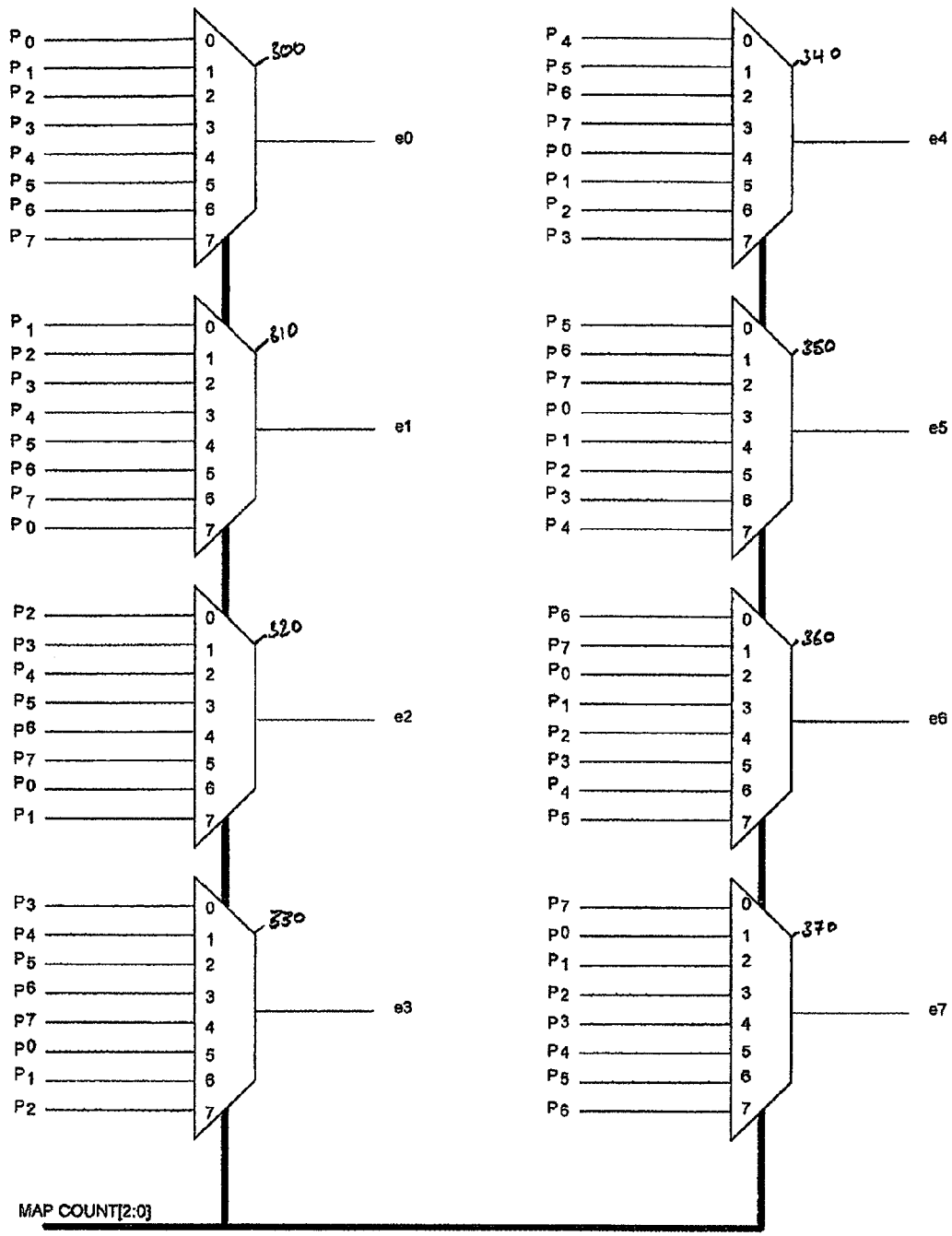
FIG. 5 schematically illustrates a multiplexer implementation of a mapping operation.

FIG. 5 illustrates a multiplexer implementation of a different mapping operation to that illustrated in FIGS. 3 and 4. Here MAP COUNT is provided as the selection input to a set of eight multiplexers 300 to 370. Each multiplexer is configured to have the input configuration of the previous multiplexer but rotated by one position. Thus, the eight possible values of MAP COUNT steer the multiplexers to provide the eight possible rotations of the input values. The input values are given by the pattern bits $p_0$ to $p_7$ from FIG. 2. For example, when MAP COUNT is 0, each multiplexer provides its first input value as its output, i.e. multiplexer 300 provides input $p_0$ as $e_0$, multiplexer 310 provides input $p_1$ as $e_1$ and so on, multiplexer 370 providing input $p_7$ as $e_7$. This is the null rotation of the input values, each input value mapping directly to its equivalent output value. As another example, when MAP COUNT equals 3, then each of multiplexers 300 to 370 takes its fourth input to provide as its output. Hence, multiplexer 300 generated $e_0$ from input $p_3$, multiplexer 310 generates $e_1$ from input $p_4$, multiplexer 320 generates $e_2$ from input $p_5$ and so on, multiplexer 370 generating $e_7$ from input $p_2$.

Figure 6:
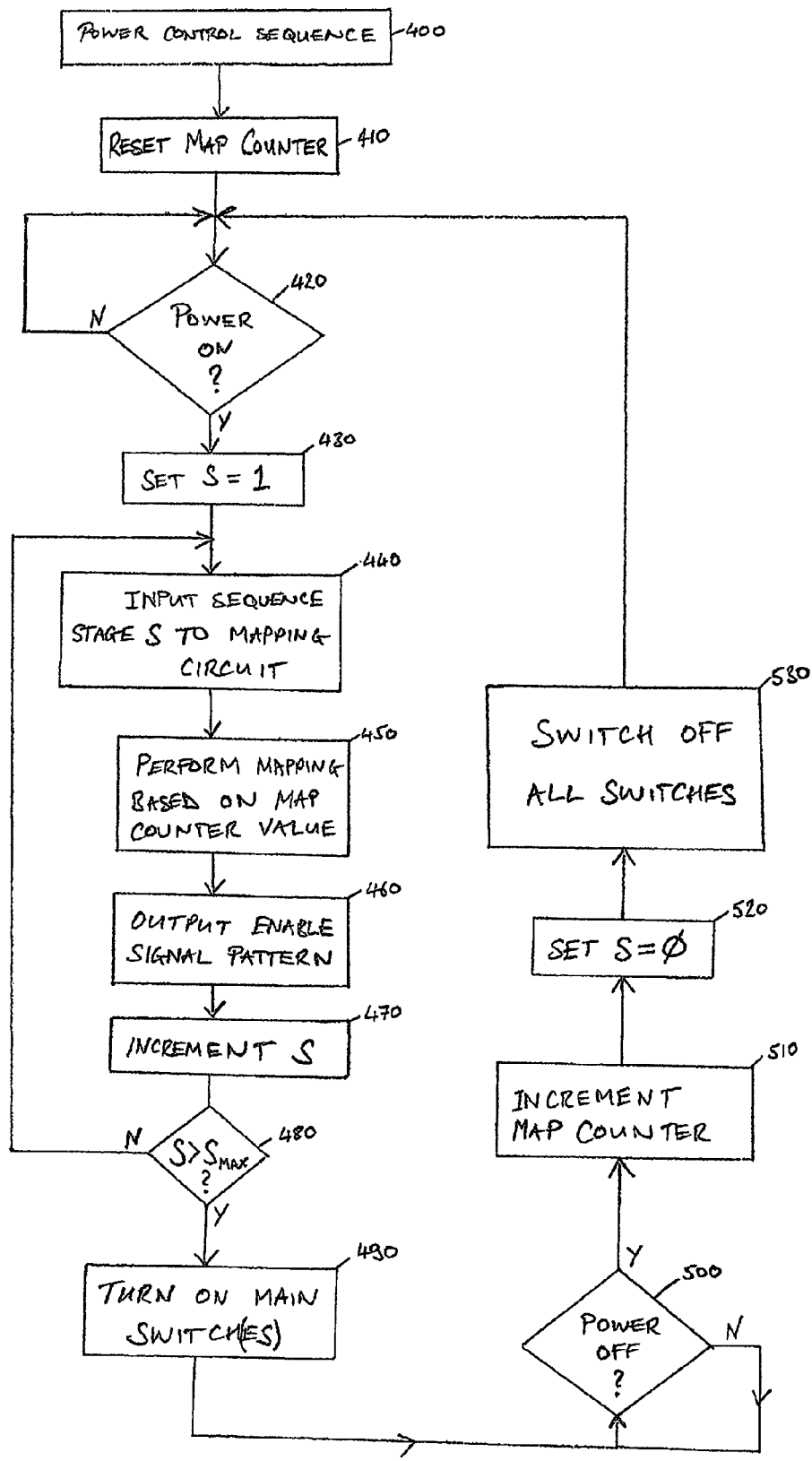
FIG. 6 is a flow diagram schematically illustrating the steps of implementing time-varying mapping on a power control sequence.

FIG. 6 illustrates the series of steps carried out in performing a power control sequence. The power control sequence begins at step 400 proceeding to step 410 where the map counter is reset (i.e. MAP COUNT is set to 0 within mapping control counter 100). Then at step 420 if power-on is not required the flow waits. When power-on is required, sequence stage indicator s is set to 1 at step 430 and then at step 440 sequence stage s is passed from sequence logic 80 to mapping function circuit 90. At step 450 mapping function circuit 90 performs the mapping of the configuration pattern of sequence stage s based on the map counter value (MAP COUNT) stored in mapping control counter 100 and received as control signals by mapping function circuit 90. This generates the enable signal pattern which is then output to the turn-on header switches 20 at step 460. Sequence stage counter s is then incremented at step 470, and at step 480 it is tested if s now exceeds $s_{max}$, $s_{max}$ corresponding to the final sequence stage of the turn-on sequence. If s has not yet reached this value then the flow returns to step 440, the next sequence stage then being mapped and output. When s is found to exceed $s_{max}$ at stage 480, the flow proceeds to step 490 where any main header switches which do not form part of the turn-on sequence are then turned on. At step 500, the flow then waits until power-off is required. When power-off is required the flow proceeds to step 510 where the map counter is incremented, such that when the next power-on sequence takes place, the mapping will be different. At step 520, sequence stage counter s is set to 0 corresponding to all turn-on header switches being off and at step 530 all switches, including main header switches, are turned off. The flow then returns to step 420 where a power-on request is waited for.

Hence, according to embodiments of the present invention, the stress suffered by switch blocks that are employed early in a turn-on sequence can be evenly shared out between a set of turn-on switch blocks. This is achieved by mapping a configuration pattern of each stage of a turn-on sequence into a set of enable signals for the switch blocks, the mapping being altered each time the turn-on sequence is carried out. Alternatively the method and apparatus of embodiments of the present invention may be employed to purposely impose a harsh turn-on sequence on particular switches in a test environment, e.g. repeatedly selecting a particular switch as the first in the turn-on sequence, in order to aggressively test how long a given switch can sustain such "abuse", whilst varying the enable signal patterns for later stages of the turn-on sequence.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Power control circuitry for controlling connection of a voltage source to a switched power rail powering an associated circuit comprising:
    a plurality of switch blocks connected in parallel between said switched power rail and said voltage source, each switch block controlled by an enable signal which, when set, causes that switch block to connect said switched power rail to said voltage source; and
    a switch controller for performing a turn-on sequence comprising a plurality of sequence stages, such that the switch controller provides for each sequence stage an enable signal pattern identifying which enable signals are set, for at least one of the sequence stages, said switch controller is configured to apply a time-varying generation operation when generating the corresponding enable signal pattern, whereby, when the turn-on sequence is later repeated, a later enable signal pattern produced for said at least one of said sequence stages differs from the enable signal pattern previously produced for said at least one of said sequence stages.

2. Power control circuitry as claimed in claim 1, wherein said time-varying generation operation is a time-varying mapping operation, said time-varying mapping operation being applied to a configuration pattern of said at least one of the sequence stages to generate the corresponding enable signal pattern.

3. Power control circuitry as claimed in claim 2, wherein said time-varying mapping operation employs a predetermined plurality of mapping functions, a current mapping function being selected from said predetermined plurality of mapping functions dependent on a control input.

4. Power control circuitry as claimed in claim 2, wherein said time-varying mapping function reorders said configuration pattern to produce the enable signal pattern.

5. Power control circuitry as claimed in claim 1, wherein said time-varying generation operation is changed dependent on a control input.

6. Power control circuitry as claimed in claim 5, wherein said control input comprises a counter value.

7. Power control circuitry as claimed in claim 6, wherein said counter value is incremented each time a turn-off sequence is applied to decouple said switched power rail from said voltage source.

8. Power control circuitry as claimed in claim 5, wherein said control input comprises a pseudo-random generated value.

9. Power control circuitry as claimed in claim 1, wherein said plurality of switch blocks are starter switch blocks, and further comprising at least one main switch block between said switched power rail and said voltage source, said switch controller being configured to turn on said at least one main switch block once said turn-on sequence has been performed.

10. Power control circuitry as claimed in claim 1, further comprising a supply voltage power rail coupled to said voltage source, said plurality of switch blocks being header blocks coupled to said supply voltage power rail and serving to connect said switched power rail to said voltage source via said supply voltage power rail.

11. Power control circuitry as claimed in claim 1, further comprising a ground voltage power rail coupled to said voltage source, said plurality of switch blocks being footer blocks coupled to said ground voltage power rail and serving to connect said switched power rail to said voltage source via said ground voltage power rail.

12. Power control circuitry as claimed in claim 1, wherein said time-varying generation function is implemented by multiplexer circuitry.

13. Power control circuitry as claimed in claim 1, wherein said time-varying generation function is implemented by a look-up table.

14. Power control circuitry as claimed in claim 1, wherein each later enable signal pattern produced for each of said sequence stages differs from the enable signal pattern previously produced for each corresponding one of said sequence stages.

15. A method of controlling connection of a voltage source to a switched power rail powering an associated circuit, comprising the steps of:
    connecting a plurality of switch blocks in parallel between said switched power rail and said voltage source, each switch block controlled by an enable signal which, when set, causes that switch block to connect said switched power rail to said voltage source;
    performing a turn-on sequence comprising a plurality of sequence stages, by providing for each sequence stage an enable signal pattern identifying which enable signals are set, wherein, for at least one of the sequence stages, applying a time-varying generation operation when generating the corresponding enable signal pattern, whereby, when later repeating the turn-on sequence, a later enable signal pattern for said at least one of said sequence stages differs from the enable signal pattern previously produced for said at least one of said sequence stages.

16. Power control circuitry for controlling connection of a voltage source to a switched power rail powering an associated circuit comprising:
a plurality of switch blocks means, each of said switch block means for controllably connecting said switched power rail to said voltage source, each of said switch block means is connected in parallel between said switched power rail and said voltage source, each switch block means is responsive to a respective enable signal which, when said enable signal is set, causes that switch block means to connect said switched power rail to said voltage source; and
a switch controller means for performing a turn-on sequence comprising a plurality of sequence stages, such that the switch controller means provides, for each sequence stag; an enable signal pattern identifying which enable signals are set, wherein for at least one of the sequence stages, said switch controller means is configured to apply a time-varying generation operation when generating the corresponding enable signal pattern, whereby, when the turn-on sequence is later repeated, a later enable signal pattern produced for said at least one of said sequence stages differs from the enable signal pattern previously produced for said at least one of said sequence stages.

17. Power control circuitry for controlling connection of a voltage source to a switched power rail powering an associated circuit comprising:
a plurality of switch blocks connected in parallel between said switched power rail and said voltage source, each switch block being controlled by an enable signal which when set causes that switch block to connect said switched power rail to said voltage source; and
a switch controller for performing a turn-on sequence comprising a plurality of sequence stages, such that the switch controller provides for each sequence stage an enable signal pattern identifying which enable signals are set, said turn-on sequence causing a sequential turning-on of said plurality of switch blocks until all enable signals are set, wherein, for at least one of the sequence stages, said switch controller is configured to apply a time-varying generation operation when generating the corresponding enable signal pattern, whereby, when the turn-on sequence is later repeated, a later enable signal pattern produced for said at least one of said sequence stages differs from the enable signal pattern previously produced for said at least one of said sequence stages.

18. Power control circuitry for controlling connection of a voltage source to a switched power rail powering an associated circuit, said power control circuitry comprising:
a plurality of switch blocks, each switch block directly connecting said switched power rail and said voltage source, each switch block responsive to a respective enable signal which, when enabled, connects said switched power rail to said voltage source through a respective switch block; and
a switch controller for controlling connection of said voltage source to said switched power rail, said controller providing said respective enable signal to each of said switch blocks in a plurality of time-wise turn-on sequences, wherein each of said turn-on sequences varies, among said plurality of switch blocks, a switch block receiving the first of said enable signals in each turn-on sequence.

* * * * *